United States Patent [19]
Takahashi et al.

[11] Patent Number: 6,096,259
[45] Date of Patent: *Aug. 1, 2000

[54] FABRICATION METHOD OF PLASTIC-MOLDED LEAD COMPONENT

[75] Inventors: Nobuaki Takahashi; Koji Soejima; Naoji Senba; Yuzo Shimada, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/925,724

[22] Filed: Sep. 9, 1997

[30] Foreign Application Priority Data

Sep. 9, 1996 [JP] Japan .................... 8-237585

[51] Int. Cl.$^7$ .................................. B29C 70/72
[52] U.S. Cl. .................... 264/600; 264/219; 264/272.13; 264/272.14
[58] Field of Search .......................... 264/272.11, 272.15, 264/272.16, 272.17, 161, 600, 272.14, 272.13; 425/114, 121, 123; 174/50.52, 59

[56] References Cited

U.S. PATENT DOCUMENTS

| | | | |
|---|---|---|---|
| 2,924,850 | 2/1960 | Schultz | 18/36 |
| 4,505,844 | 3/1985 | Ebi et al. | 346/140 |
| 4,890,126 | 12/1989 | Hotomi | 346/140 |
| 5,174,942 | 12/1992 | Barnadas | 264/272.15 |
| 5,275,765 | 1/1994 | Go et al. | 264/272.14 |
| 5,456,791 | 10/1995 | Ueno | 264/272.15 |
| 5,542,171 | 8/1996 | Juskey et al. | 29/840 |
| 5,724,730 | 3/1998 | Tanaka | 264/272.15 |

FOREIGN PATENT DOCUMENTS

| | | |
|---|---|---|
| 539148 | 4/1993 | European Pat. Off. . |
| 61-124003 | 8/1986 | Japan . |
| 64-48212 | 3/1989 | Japan . |
| 6-167638 | 6/1994 | Japan . |
| 7-502218 | 3/1995 | Japan . |
| WO93/11866 | 6/1993 | WIPO . |

OTHER PUBLICATIONS

Patent Abstracts of Japan, vol. 008, No. 069 (M–286) Mar. 31, 1984.

Patent Abstracts of Japan, vol. 097, No. 005, May 30, 1997.

*Primary Examiner*—Angela Ortiz
*Attorney, Agent, or Firm*—Sughrue, Mion, Zinn, Macpeak & Seas, PLLC

[57] ABSTRACT

A fabrication method of a plastic-molded lead component is provided, in which leads are aligned at a fine pitch of approximately 100 μm or less with a high accuracy, a simplified process sequence, and a low cost. First, a template having opened V-grooves is prepared. The V-grooves extend along a straight line and are aligned in parallel at a fixed pitch. Second, wire pieces are placed in the respective grooves of the template. Third, the placed pieces of the wire pieces are aligned in parallel on the template at a same pitch as that of the grooves. Fourth, a molding compound is supplied onto the template with or without the use of a mold to bury the aligned wire pieces placed in the grooves. Fifth, the molding compound supplied onto the template is cured to form an encapsulation plastic on the template. The wire pieces placed in the grooves are encapsulated by the encapsulation plastic in such a way that both ends of the wire pieces are exposed from opposite sides of the encapsulation plastic. The encapsulated wire pieces serve as leads. Finally, the template is removed from tie encapsulated wire pieces and the encapsulation plastic. The template is preferably formed by a semiconductor material such as silicon.

9 Claims, 7 Drawing Sheets («FABRICATION METHOD OF PLASTIC-MOLDED LEAD COMPONENT»)

FABRICATION METHOD OF PLASTIC-MOLDED LEAD COMPONENT

BACKGROUND OF THE INVENTION

1. Field of the Invention

The present invention relates to a fabrication method of a lead component and more particularly, to a fabrication method of a plastic-molded lead component serving as a connector, a coupler, and so on, which has aligned leads protruding from a molding plastic and which is used for electrically connecting the component to the outside.

2. Description of the Prior Art

A conventional lead component of this sort is shown in FIG. 3.

As shown in FIG. 3, this lead component 119 has electrically-conductive leads 102 molded by a molding plastic, i.e., a plastic tie-bar 118. The tie bar 18 has a shape of a rectangular parallelepiped. The leads 102 are fixed by and buried in the tie-bar 118 to penetrate the same.

Protruding parts of the leads 102 from one side of the tie bar 118 are aligned at a fixed pitch and extend outward in parallel to one another. Protruding parts of the leads 102 from the opposite side of the tie bar 118 are also aligned at the same pitch and extend outward in parallel to one another.

The protruding parts of the leads 102 at one side of the plastic tie-bar 118 are electrically connected to some leads of an electronic device/element or terminals of a circuit board on which electronic devices/elements are mounted, respectively. The protruding parts of the leads 102 at the opposite side of the tie bar 118 are used for electrically connecting the electronic device/element or the circuit board to the outside circuitry.

A fabrication method of the conventional lead component 119 shown in FIG. 3 is explained below with reference to FIGS. 1 and 2.

First, as shown in FIGS. 1 and 2, upper and lower molds 114 and 115, each of which is made of a metal such as stainless steel, are prepared. On the other hand, a pair of gripping jigs 117, which are made of a metal such as stainless steel, are prepared.

The upper mold 114 has V-shaped grooves 116A for aligning metal wire pieces 102' to be used for the leads 102 on its lower surface. The grooves 116A are aligned at the same pitch as that of the leads 102 in parallel to one another.

Similarly, the lower mold 115 has V-shaped grooves 116B for aligning the metal-wire pieces 102' on its upper surface. The grooves 116B are aligned at the same pitch as that of the leads 102 in parallel to one another.

The pair of gripping jigs 117 usually have no grooves on their inner surfaces.

Next, the ends of the wire pieces 102' are placed on the lower mold 115 to be located in the respective grooves 116B. Then, the upper mold 114 is coupled with the lower mold 115 in such a way that the V-grooves 116A of the upper mold 114 are coupled with the corresponding V-grooves 116B of the lower mold 115, thereby forming aligning cavities. Thus, the ends of the wire pieces 102' are held to be aligned along a straight line by the aligning cavities, as shown in FIGS. 1 and 2.

Subsequently, the protruding parts of the wire pieces 102' from the coupled molds 114 and 115 are gripped at their opposite ends to the molds 114 and 115 by the pair of gripping jigs 117, as shown in FIG. 2. The pair of gripping jigs 117 are apart from the molds 114 and 115.

Then, while applying tension to the wire pieces 102' with the use of the molds 114 and 115 and the pair of jigs 117, the aligned wire pieces 102' are molded by a molding plastic (not shown) at a location between the coupled molds 114 and 115 and the pair of jigs 117 through popular plastic-molding processes. Thus, the wire pieces 102' are fixed by the molding plastic, i.e., the plastic tie-bar 116 at an approximately center of the wire pieces 102', as shown in FIG. 2.

Finally, the wire pieces 102' are cut at each side of the tie bar 118 to thereby separate the coupled molds 114 and 115 and the pair of jigs 117 from the wire pieces 102'. As a result, the remaining wire pieces 102', i.e., the leads 102, are fixed by the tie bar 118 and protrude from each side of the tie bar 118.

Thus, the conventional plastic-molded lead component 119 as shown in FIG. 3 is fabricated.

Although the conventional plastic-molded lead component 119 has a single row of the leads 102 at each side of the molding plastic 118, it may have a plurality of parallel rows of the leads 102.

Another conventional lead component of the above sort is shown in FIG. 4, which serves as an agglomerate generator of a particulate substance and is applicable to a printer head. This conventional component was disclosed in the Japanese Publication No. 7-502218 of the PCT application No. PCT/AU92/00665 published in March 1995.

As shown in FIG. 4, an electrically-conductive body 220 has a tapered shape. An electrically-conductive feeding tube 221 is provided in the body 220 to be electrically connected to the body 220. The feeding tube 221 has a peak at its end located at the thin side of the body 220. This peak of the tube 221 has a small radius of curvature, which is termed an ejection point 222.

The opposite end of the feeding tube 221 to the ejection point 222 is connected to a liquid feeding system 223 (not shown). This liquid feeding system 223 is capable of feeding a specific liquid containing ink particles under a constant pressure. Excessive portions of the supplied liquid are extracted to the outside through an extracting path 224A and an extracting tube 224B each provided in the body 220. The opposite end of the extracting tube 224B to the ejection point 222 is connected to a liquid extracting system 225 (not shown) located outside the body 220.

A voltage source 226 is provided outside the body 220. The voltage source 226 supplies a suitable voltage to the body 220 as necessary and consequently, the suitable voltage may be applied to the feeding tube 221. The liquid containing the ink particles is fed into the feeding tube 221 by the liquid feeding system 223 and then, it travels through the tube 221 toward the ejection point 222.

The electric field generated by the applied voltage is the highest at the ejection point 222. Therefore, the liquid containing the ink particles is ejected toward a printing medium 213 placed apart from the ejection point 222. The ejected liquid travels to the medium 213 in a direction perpendicular to the medium 213. Thus, the ejected liquid containing the ink particles are printed on the medium 213.

Still another conventional lead component of the above sort is shown in FIG. 5, which was disclosed in the above Japanese Publication No. 7-502218 of the PCT application No. PCT/AU92/00665.

As shown in FIG. 5, this conventional lead component is a variation of the agglomerate generator shown in FIG. 4, and has the same configuration as that of the above conventional component in FIG. 4 other than that a plurality of ejection points are provided. Therefore, the explanation about the same configuration is omitted here by adding the same reference numerals to the same or corresponding elements in FIG. 5 for the sake of simplicity.

In FIG. 5, a blade 227 is fixed to and electrically connected to the thin-side end of the tapered body 220. The blade 227 protrudes from the facing thin-side end of the body 220.

Here, the body 220 has three electrically-conductive strips 229 extending from the thick-side end of the body 220 to the thin-side end thereof. The strips 229 are electrically connected to the corresponding voltage sources 226 provided outside the body 220. The strips 229 are electrically insulated from one another by an insulating material 228 provided in the body 220.

Similarly, the blade 227 has three electrically-conductive strips 231 extending along the same direction as that of the strips 229 of the body 220. The strips 231 are electrically connected to the corresponding strips 229. The strips 231 are electrically insulated from one another by an insulating material 230 provided on the blade 227.

The peaks of the strips 231, which protrude from the insulating material 230 of the blade 227, serve as the ejection points 222, respectively.

With the conventional plastic-molded lead component shown in FIG. 1, the V-grooves 116A and 116B of the upper and lower metal molds 114 and 115 need to be formed by the known machining technique or known laser processing technique. Therefore, the following problems will occur.

Specifically, if the leads 102 are aligned at a fine pitch of approximately 100 $\mu$m or less, the V-grooves 116A and 116B are necessarily formed to be aligned at the same fine pitch. However, these grooves 116A and 116B cannot be uniformly formed with the use of the conventional machining or laser processing technique. This is because (i) the dimensional accuracy of the machining tools such as drills, (ii) the machining or laser processing accuracy, and (iii) the process control technique accuracy are all poor.

If the grooves 116A and 116B have the non-uniform top-end width, bottom-end angle, and/or depth, the positional deviation or shift of the aligned leads 102 by the molds 114 and 115 will be generated.

Thus, due to the dimensional and aligning accuracy limits of the grooves 116A and 116B of the upper and lower molds 114 and 115, the obtainable pitch of the grooves 116A and 116B is approximately 1 mm at the minimum. This means that the obtainable pitch of the leads 102 is approximately 100 $\mu$m at the minimum. Any finer pitch is unable to be realized.

Further, since the grooves 116A and 116B are successively formed one by one by the machining or laser technique, not only a lot of time is necessary for completing the grooves 116A and 116B but also the fabrication cost becomes high.

With the conventional plastic-molded lead components shown in FIGS. 4 and 5 to decrease the printing dot size for higher resolution, the ejection points 222 need to be aligned at a fine pitch on the body 220. This requires the patterning process of the electrically-conductive strips 229 and 231 using radiation exposure and development processes.

In this case, there arises a problem that the formation processes of the strips 229 and 231 are complicated and the fabrication cost is high.

SUMMARY OF THE INVENTION

Accordingly, an object of the present invention is to provide a fabrication method of a plastic-molded lead component in which leads are aligned at a fine pitch of approximately 100 $\mu$m or less with a high accuracy.

Another object of the present invention is to provide a fabrication method of a plastic-molded lead component in which leads are aligned at a fine pitch less than approximately 100 $\mu$m with a simplified process sequence and a low cost.

The above objects together with others not specifically mentioned will become clear to those skilled in the art from the following description.

A fabrication method of a plastic-molded lead component according to the present invention is comprised of the following steps:

(a) A template having opened V-grooves is prepared. The V-grooves extend along a straight line and are aligned in parallel at a fixed pitch.

(b) Wire pieces are placed in the respective grooves of the template. The placed pieces of the wire pieces are aligned in parallel on the template at a same pitch as that of the grooves.

(c) A molding compound is supplied onto the template with or without the use of a mold to cover the aligned wire pieces placed in the grooves.

(d) The molding compound supplied onto the template is cured to form an encapsulation plastic on the template. The wire pieces placed in the grooves are encapsulated by the encapsulation plastic in such a way that both ends of the wire pieces are exposed from opposite sides of the encapsulation plastic. The encapsulated wire pieces serve as leads.

(e) The template is removed from the encapsulated wire pieces and the encapsulation plastic.

With the fabrication method of a plastic-molded lead component according to the present invention, the template having the opened V-grooves is prepared, and then, the wire pieces are placed in the respective grooves of the template. Thus, the wire pieces are aligned by the V-grooves in parallel at a fixed pitch.

Therefore, if the template is formed by a rigid material allowing the V-grooves to be aligned at a fine pitch of approximately 100 $\mu$m or less with a high accuracy, the wire pieces can be aligned at a fine pitch of approximately 100 $\mu$m or less with a high accuracy on the template.

Thereafter, the molding compound is simply supplied onto the template and cured, thereby forming the encapsulation plastic having the protruding leads.

As a result, the leads are fixed and aligned by the encapsulation plastic at a desired fine pitch of approximately 100 $\mu$m or less with a high accuracy.

Further, the necessary process steps are (a) preparation of the template, (b) placement of the wire pieces in the grooves, (d) supply of the molding compound onto the template, (d) curing of the supplied compound to form the encapsulation plastic, and (e) removal of the template. Accordingly, a plastic-molded lead component can be fabricated with a simplified process sequence and a low cost.

In the fabrication method according to the present invention, the template may be formed by any rigid material allowing the V-grooves to be aligned at a fine pitch of approximately 100 $\mu$m or less with a high accuracy. However, it is preferred that the template is formed by a semiconductor material such as silicon (Si), because the desired V-grooves can be readily realized by a popular anisotropic etching process.

The shape and size of the V-grooves may be optionally determined according to the size (or, diameter) of the wire pieces or leads. When the wire pieces are placed in the V-grooves, the wire pieces may be entirely buried in the grooves or they may partially protrude from the grooves.

The wire pieces serving as the leads may be made of any material as necessary. The size of the wire pieces may be optionally determined as necessary.

The molding compound may be made any material such as epoxy-, silicone-, and amine-system resins as necessary. The supplying method of the molding compound is optionally selected as necessary. A mold may be or may not be used for the supplying process (c).

The curing method of the molding compound is optionally selected as necessary.

The size and shape of the encapsulation plastic may be optionally determined as necessary.

In a preferred embodiment of the method according to the present invention, a step (f) of forming another encapsulation plastic to be coupled with the encapsulation plastic formed in the step (d) is performed after the step (e).

In this case, there is an additional advantage that when the leads are partially exposed from the encapsulation plastic formed in the step (d), the exposed leads are encapsulated by the additionally-formed encapsulation plastic in the step (f).

In another preferred embodiment of the method according to the present invention, a step (g) of polishing the encapsulation plastic is performed after the step (e) to adjust the thickness of the encapsulation plastic.

In this case, there is an additional advantage that when two or more ones of the plastic-molded lead components are stacked to be united together, the vertical pitch of the leads can be adjusted between the two adjoining lead components.

In still another preferred embodiment of the method according to the present invention, a step (h) of applying a mold-release agent onto the surfaces of the V-grooves of the template is performed between the steps (a) and (b).

In this case, there is an additional advantage that the template is readily removed from the encapsulation plastic in the step (e).

In a further preferred embodiment ;of the method according to the present invention, the template is formed by a semiconductor material, and the V-grooves are formed by an anisotropic etching process.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described below with reference to the drawings attached.

First Embodiment

A fabrication method of a plastic-molded lead component according to a first embodiment is shown in FIGS. 6A to 6D. This plastic-molded lead component is designed for a connector with a single-row of leads.

Figure 1:
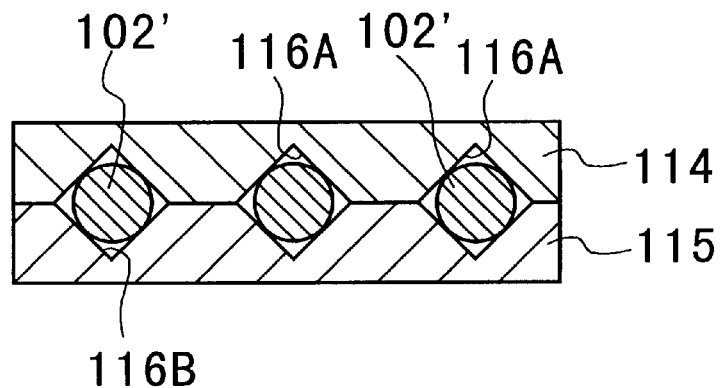
FIG. 1 is a cross-sectional view showing a conventional fabrication method of a plastic-molded lead component.
Figure 2:
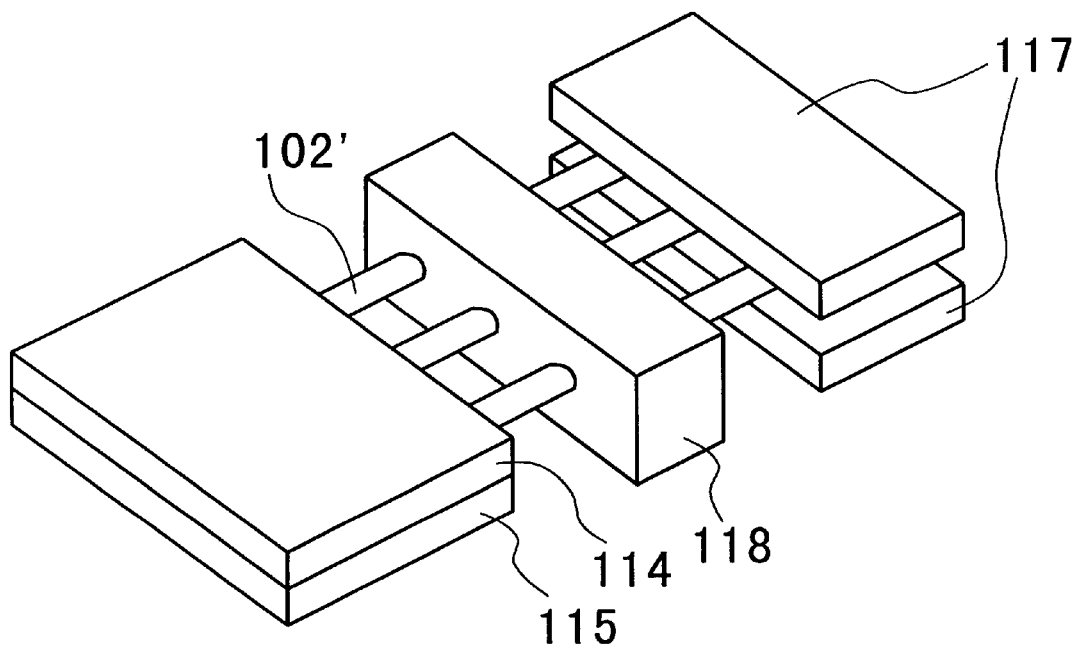
FIG. 2 is a perspective view showing the conventional fabrication method of the plastic-molded lead component in FIG. 1.
Figure 3:
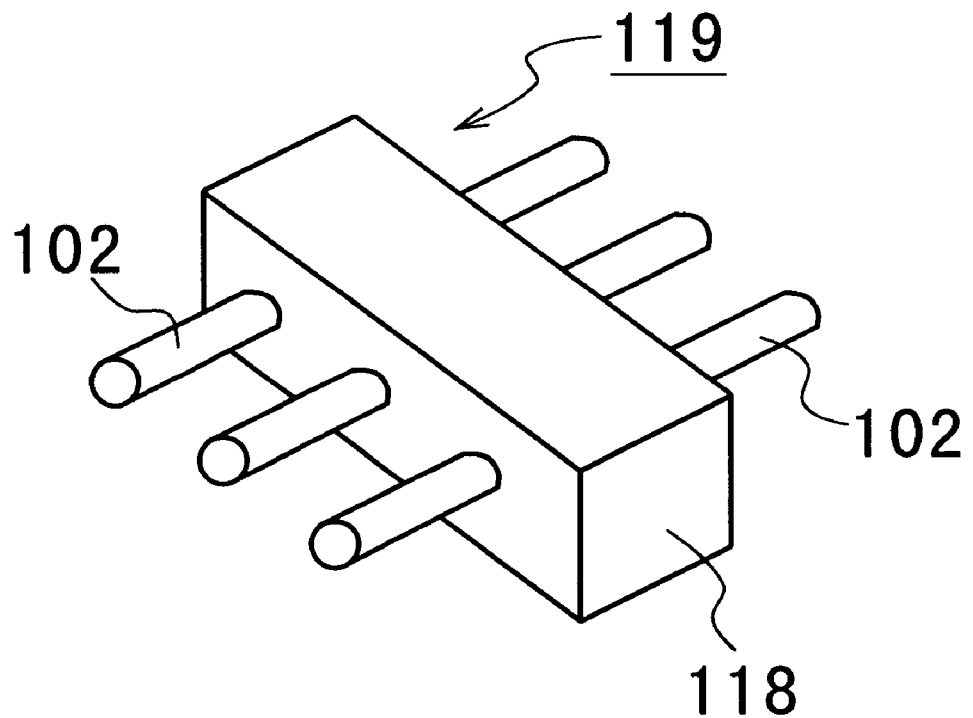
FIG. 3 is a perspective view of the plastic-molded lead component fabricated by the conventional method shown in FIGS. 1 and 2.
Figure 4:
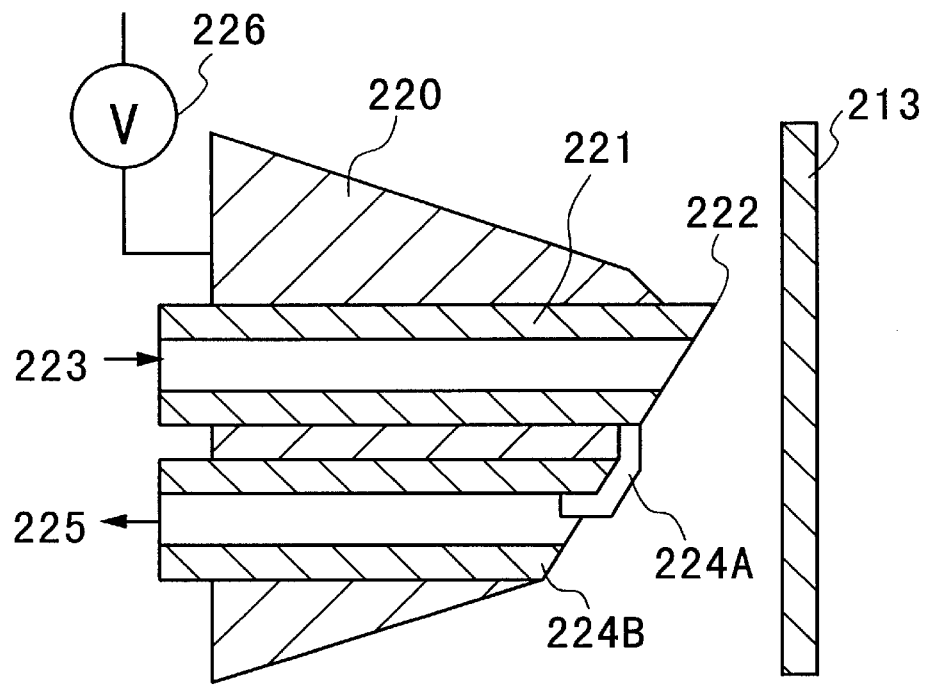
FIG. 4 is a cross-sectional view of another conventional plastic-molded lead component, which is designed for a printer head with an ejection point.
Figure 5:
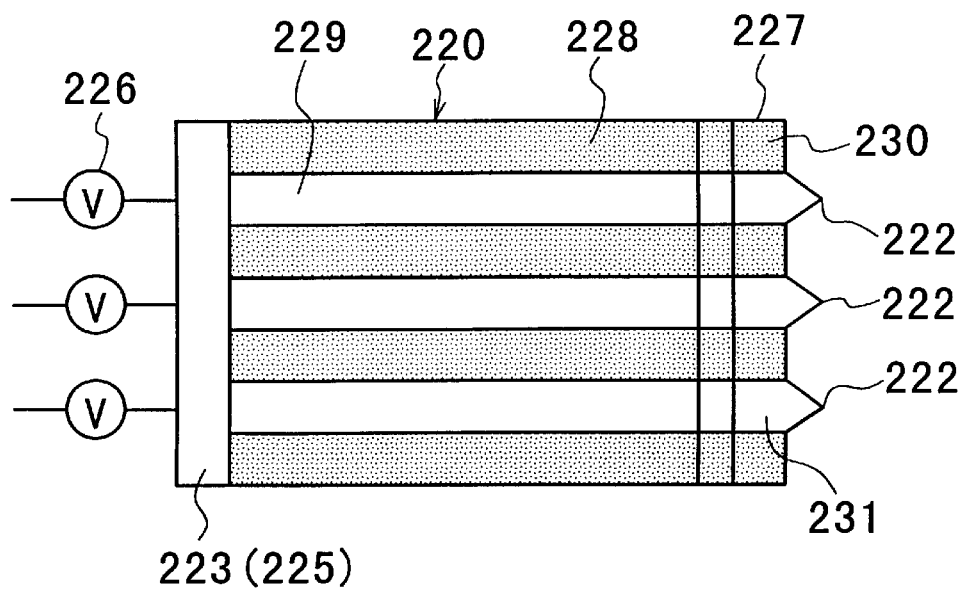
FIG. 5 is a plan view of still another conventional plastic-molded lead component, which is designed for a printer head with a plurality of ejection points.
Figure 6A:
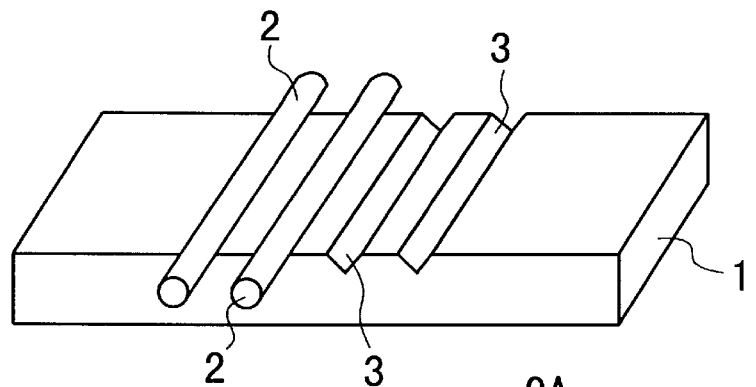
FIGS. 6A to 6D are perspective views showing a fabrication method of a plastic-molded lead component designed for a connector according to a first embodiment of the present invention, respectively.

First, as shown in FIG. 6A, opening grooves 3 with a V-shaped cross section are formed to be aligned in parallel at a fixed pitch on a main surface of a single-crystal silicon substrate or sheet. These V-grooves 3 may be readily realized by a popular anisotropic etching process that has been used in the semiconductor device fabrication.

The V-grooves 3 extend along a straight line from one side of the template 1 to another, which are aligned in parallel. The parallel grooves 3 are arranged at a fixed pitch along the longitudinal axis of the template 1. The grooves 3 are used for laying out (or, aligning) and for provisionally holding pieces 2 of an electrically-conductive wire.

The shape (i.e., width, depth, and bottom angle) of the grooves 3 are optionally determined according to the diameter of the wire pieces 2.

Next, the wire pieces 2 are placed in the respective grooves 3 of the template 1, as shown in FIG. 6A. The placed wire pieces 2 are aligned in parallel on the template at the same pitch as that of the V-grooves 3.

It is preferred that the wire pieces 2 have the least bend possible to ensure their good placement. The placement or alignment of the pieces 2 may be efficiently performed if a suitable vibrator is used during this step.

Figure 6B:
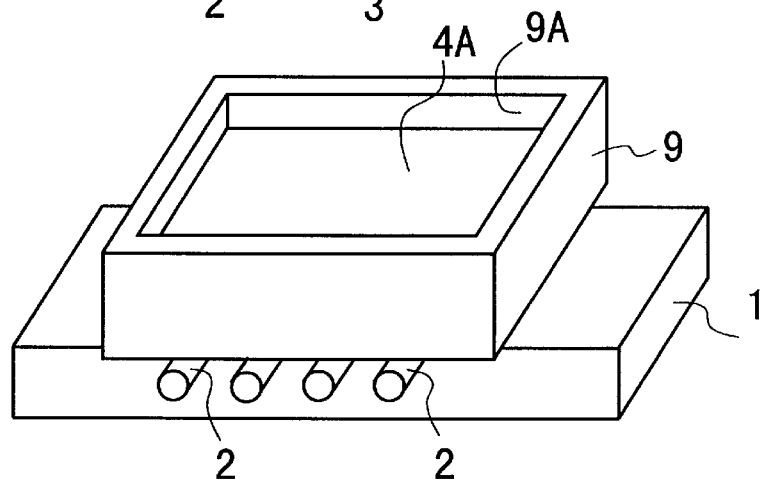

Following this step, a rectangular-shaped mold 9 with opened top and bottom ends is placed on the template 1 to cover the wire pieces 2, as shown in FIG. 6B. The mold 9 has a cavity 9A with a shape of a rectangular parallelepiped. The tops of the wire pieces 2 in the grooves 3 are slightly higher than the upper surface of the template 1. Therefore, the pieces 2 are pressed by the mold 9. This means that the pieces 2 are not movable during this step.

At this stage, to facilitate the release of a cured molding compound from the template 1, it is preferred that a suitable mold-release agent such as a silicone-system agent is applied onto the surfaces of the V-grooves 3 of the template 1.

Subsequently, a molten compound 4A such as an epoxy resin is supplied to the cavity 9A of the mold 9 through the opened top end of the same to partially bury the wire pieces 2 in the grooves 3. Prior to the supply of the compound 4A, the template 1 is usually heated up to a suitable temperature such as 50 to 60° C. At this stage, the molding compound 4A is contacted with the surfaces of the V-grooves 3 and the remaining upper surface of the template 1.

If the molten molding compound 4A has a sufficiently high viscosity, no mold is necessary for this process. Even in this case, the placed wire pieces 2 in the grooves 3 are not moved unless a comparatively strong vibration or shock is applied to the template 1.

Then, the supplied molding compound 4A is cured at a specific temperature such as 100 to 150° C., thereby forming an encapsulation plastic 4 on the wire pieces and the template 1. The curing time is, for example, an hour for an epoxy resin. The mold 9 is then released from the encapsulation plastic 4 and removed from the template 1.

Figure 6C:
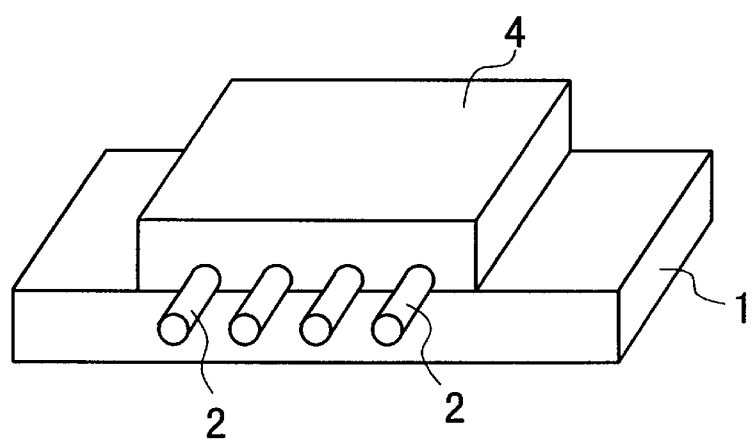

The encapsulation plastic 4 has a shape of a rectangular parallelepiped, as shown in FIG. 6C. At this stage, the wire pieces 2 are fixed by and buried in the encapsulation plastic 4 in such a way that both ends of the wire pieces 2 protrude from the opposite side sides of the plastic 4.

Figure 6D:
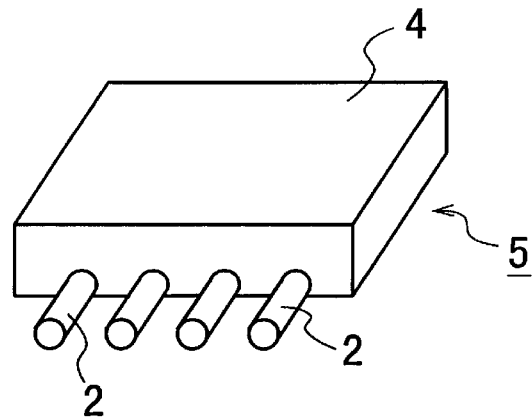

Finally, the template 1 is removed from the encapsulation plastic 4. Thus, the plastic-molded lead component 5 is fabricated, as shown in FIG. 6D.

With the fabrication method of the, plastic-molded lead component according to the first embodiment of the present invention, the template 1 having the opened V-grooves 3 is prepared, and then, the wire pieces 2 are placed in the respective grooves 3 of the template 1. Thus, the wire pieces 2 are aligned by the V-grooves 3 in parallel at a fixed pitch.

Therefore, if the template 1 is formed by a rigid material allowing the V-grooves 3 to be aligned at a fine pitch of approximately 100 μm or less with a high accuracy, the wire pieces 2 can be aligned at a fine pitch of approximately 100 μm or less with a high accuracy on the template 1.

Thereafter, the molding compound 4A is simply supplied onto the template 1 and cured, thereby forming the encapsulation plastic 4 having the protruding leads 2.

As a result, the leads 2 are fixed and aligned by the encapsulation plastic 4 at a desired fine pitch of approximately 100 μm or less with a high accuracy.

Further, the necessary process steps are (a) preparation of the template 1, (b) placement of the wire pieces 2 in the grooves 3, (d) supply of the molding compound 4A onto the template 1, (d) curing of the supplied compound 4A to form the encapsulation plastic 4, and (e) removal of the template 1. Accordingly, the plastic-molded lead component can be fabricated with a simplified process sequence.

Additionally, since the template 1 may be readily fabricated, the lead component is fabricated at a low cost.

For example, the template 1, the V-grooves 3, and the wire pieces (or, leads) 2 may have the following dimensions.

A width, a length, and a thickness of the template 1 are 10 mm, 5 mm, and 1 mm, respectively.

A depth and a bottom angle of each V-groove 3 are 70 μm and 70.6°, respectively. The pitch of the V-grooves 3 is 100 μm.

A diameter and a length of each lead 2 are 50 μm and 6 mm, respectively. A material of the lead 2 is tungsten (W).

Second Embodiment

Figure 7:
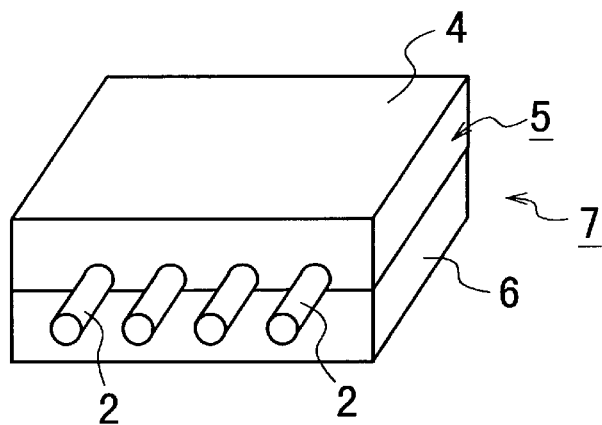
FIG. 7 is a perspective view of a plastic-molded lead component designed for a connector fabricated by a fabrication method of a plastic-molded lead component according to a second embodiment of the present invention.

FIG. 7 shows a plastic-molded lead component fabricated by a fabrication method according to a second embodiment of the present invention. This plastic-molded lead component is designed for a connector with a single-row leads and two encapsulation plastics.

In this embodiment, the same process steps as those in the first embodiment are carried out, thereby forming the plastic-molded lead component 5 as shown in FIG. 6D. Thereafter, the component 5 is turned upside down. The mold 9 is placed on the wire pieces 2 in a similar way to FIG. 6B. A molten compound 4A is supplied to the cavity 9A of the mold 9 and cured. Thus, another encapsulation plastic 6 is formed on the opposite surface of the encapsulation plastic 4, as shown in FIG. 7.

With the fabrication method of the plastic-molded lead component according to the second embodiment of the present invention, it is clear that there is the same advantages as those in the first embodiment.

Third Embodiment

Figure 8A:
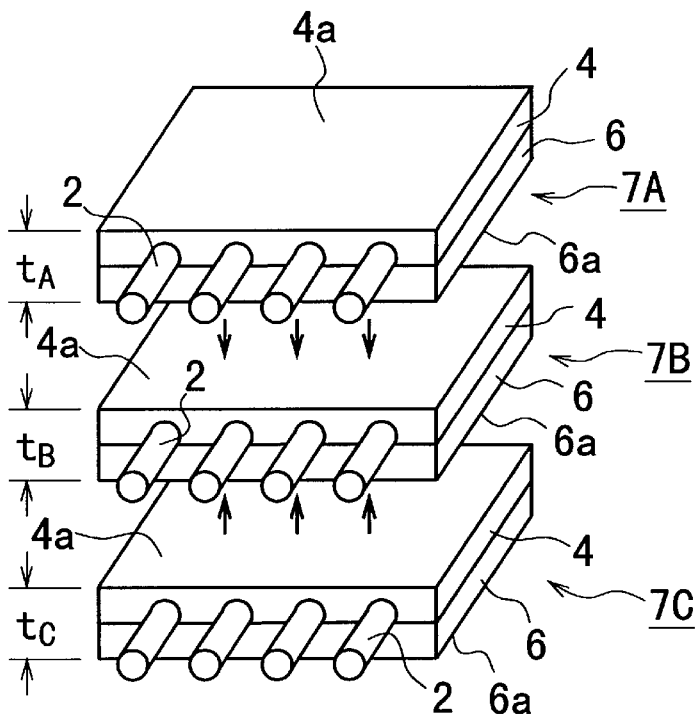
FIGS. 8A and 8B are perspective views showing a fabrication method of a plastic-molded lead component designed for a connector according to a third embodiment of the present invention, respectively.
Figure 8B:
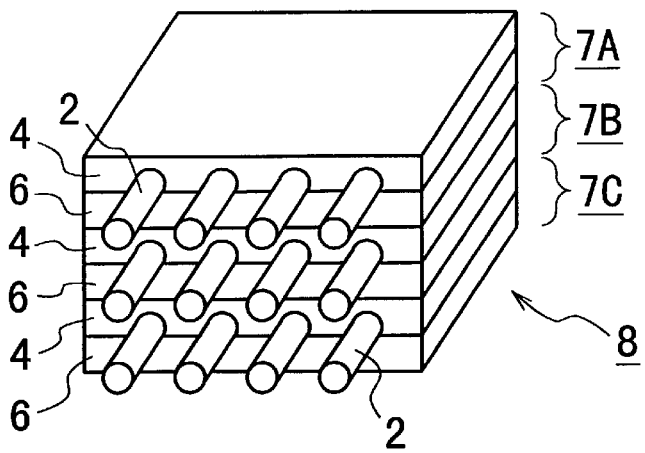

FIGS. 8A and 8B show a fabrication method of a plastic-molded lead component according to a third embodiment of the present invention. This plastic-molded lead component is designed for a connector with a multiple-row or an array leads.

In this embodiment, three plastic-molded lead components 7A, 7B, and 7C are fabricated in the same process steps as those in the second embodiment. The state at this stage-is shown in FIG. 8A.

Next, outer surfaces 4a and 6a of the encapsulation plastics 4 and 6 of the components 7A, 7B, and 7C are polished in order to adjust a vertical pitch of the leads 2.

Specifically, to adjust the thickness values $t_A$, $t_B$, and $t_c$ of the components 7A, 7B, and 7C, the upper and lower surfaces 4a and 6a of the encapsulation plastics 4 and 6 of the upper component 7A are polished. Similarly, the upper and lower surfaces 4a and 6a of the encapsulation plastics 4 and 6 of the middle component 7B are polished, and the upper and lower surfaces 4a and 6a of the encapsulation plastics 4 and 6 of the lower component 7C are polished. The polishing processes may be performed by using a known polishing machine that has been popularly used in the semiconductor device fabrication.

Thus, the vertical pitch of leads 2 of the three components 7A, 7B, and 7C are adjusted so as to fix the intervals between the adjoining two components.

Further, the three polished components 7A, 7B, and 7C are stacked and united together using a suitable adhesive, resulting in a plastic-molded lead component 8 having the array leads 2, as shown in FIG. 82.

With the fabrication method of the plastic-molded lead component according to the third embodiment of the present invention, it is clear that there is the same advantages as those in the first embodiment.

Fourth Embodiment

Figure 9:
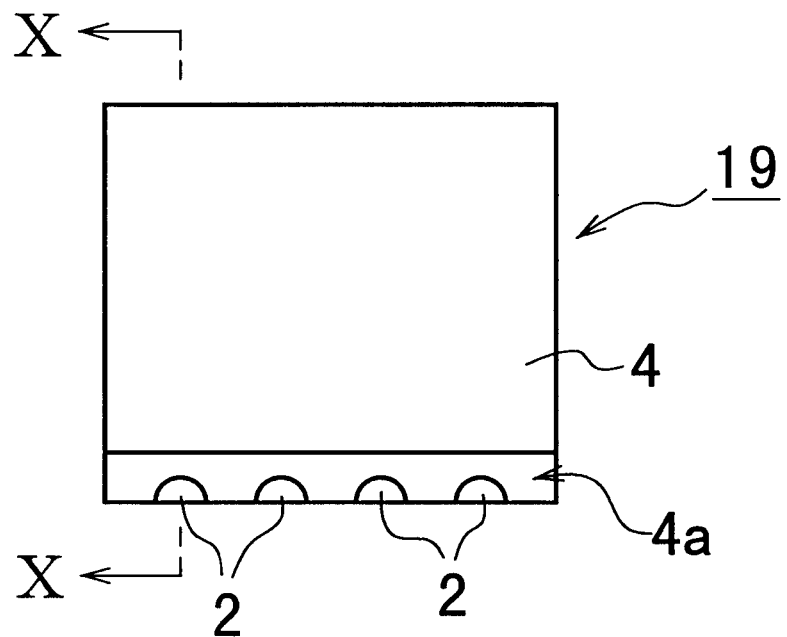
FIG. 9 is a plan view of a plastic-molded lead component designed for a printer head fabricated by a fabrication method of a plastic-molded lead component according to a fourth embodiment of the present invention.
Figure 10:
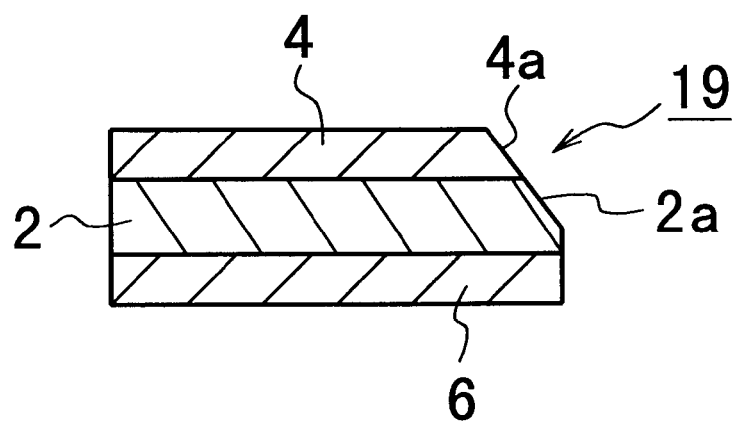
FIG. 10 is a cross-sectional view of the plastic-molded lead component fabricated by the fabrication method according to the fourth embodiment of the present invention.

FIGS. 9 and 10 show a plastic-molded lead component fabricated by a fabrication method according to a fourth embodiment of the present invention.

In this embodiment, first, the plastic-molded lead component 19 is fabricated through the same process steps as those in the second embodiment, except that both of the ends of the leads 2 do not protrude from the encapsulation plastics 4 and 6. The ends of the leads 2 are simply exposed from the plastics 4 and 6.

This configuration is realized by (i) cutting away the protruding parts of the leads 2 after fabricating the lead component 7 according to the second embodiment as shown in FIG. 7. Alternately, it is realized by (ii) previously cutting the wire pieces 2 so that the length of the wire pieces 2 accord with the width of the encapsulation plastics 4 and 6 before starting the aligning process step of the pieces 2 as shown in FIG. 6A.

Next, one end of the component 19 is obliquely removed by a popular polishing process, thereby forming an oblique face 4a of the encapsulation plastic 4 and an oblique faces 2a of the leads 2, as shown in FIGS. 9 and 10. The oblique faces 2a of the leads 2 facilitate the flow of a liquid along the leads 2.

Figure 11:
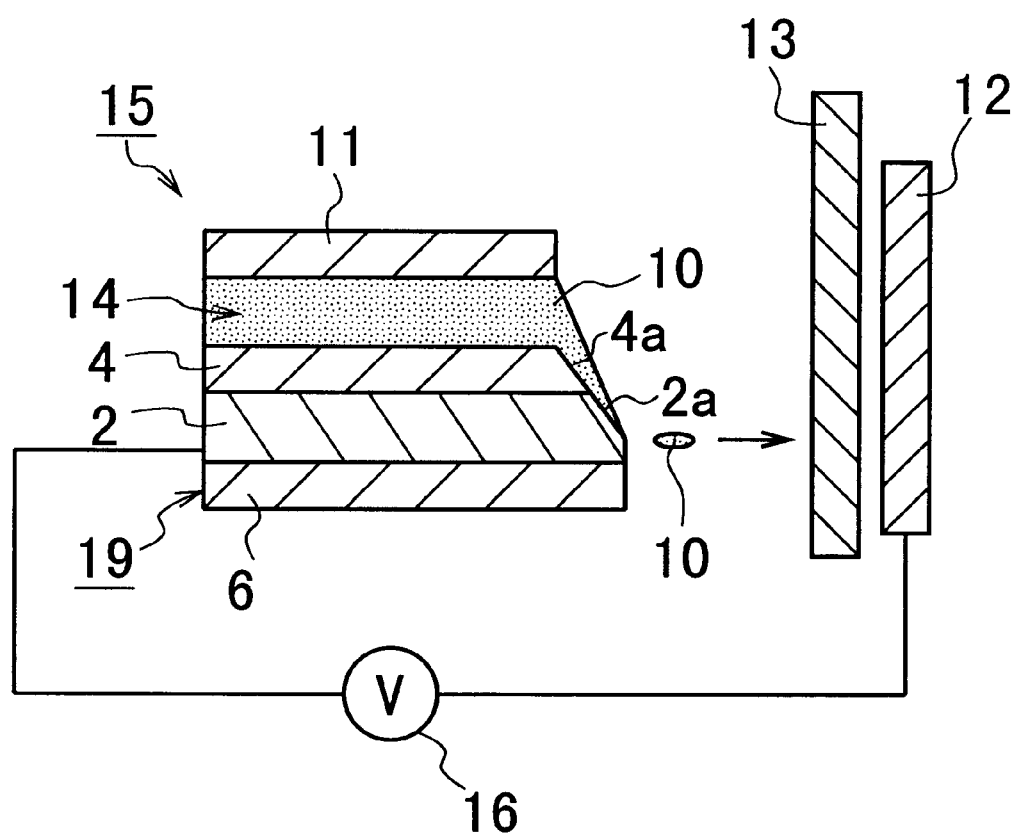
FIG. 11 is a cross-sectional view showing a usage of the plastic-molded lead component fabricated by the fabrication method according to the fourth embodiment of the present invention.

FIG. 11 shows a printer head 15 using the plastic-molding lead component 19 as shown in FIGS. 9 and 10. A cover 11 is attached to the lead component 19 to form a path 14 between the upper encapsulation plastic 4 and the cover 11. The path 14 extends from the oblique end of the component 19 to the perpendicular, opposite end thereof 9 to the oblique end.

A printing ink 10, which has been supplied to an inlet of the path 14, flows through the path 14 toward the oblique face 4a. When a printing medium 13 is located between the tapered leads 2a and an opposite electrode 12, and a proper voltage is applied across the leads 2 and the opposite electrode 12 by a voltage source 6, the ink 10 is ejected from the ends 2a of the leads 2 onto the medium 13 through the path 14.

With the fabrication method of the plastic-molded lead component according to the fourth embodiment of the present invention, it is clear that there is the same advantages as those in the first embodiment.

Therefore, the leads 2 may be aligned between the encapsulation plastics 4 and 6 at a fine pitch, the printer head 15 is capable of printing on the medium 13 with a high resolution. This means that no patterning process using radiation exposure and development processes is necessary and consequently, the fabrication method of the printer head 15 can be simplified.

Although the plastic-molded lead component is designed for a connector and a printer head in the above first to fourth embodiments, the invention is not limited thereto. It is needless to say that the present invention may be any other device or element.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a plastic-molded lead component, said method comprising the steps of:

(a) preparing a template having opened V-grooves, said V-grooves extending along a straight line and being aligned in parallel at a fixed pitch;

(b) placing wire pieces in said respective grooves of said template so that said wire pieces are aligned in parallel on said template at a same pitch as that of said grooves;

(c) supplying a molding compound onto said V-grooves of said template to cover said aligned wire pieces placed in said grooves;

(d) curing said molding compound onto said template to form an encapsulation plastic on said template, wherein said wire pieces placed in said grooves are encapsulated by said encapsulation plastic such that ends of said wire pieces are exposed from opposite sides of said encapsulation plastic, said encapsulated wire pieces serving as leads;

(e) removing said template from said wire pieces and said encapsulation plastic.

2. A method as claimed in claim 1, further comprising a step (f) of forming another encapsulation plastic coupled with said encapsulation plastic formed in said step (d);

wherein said step (f) is performed after said step (e).

3. A method as claimed in claim 1, further comprising a step (g) of polishing said encapsulation plastic to adjust the thickness of said encapsulation plastic;

wherein said step (g) is performed after said step (e).

4. A method as claimed in claim 1, further comprising a step (h) of applying a mold-release agent onto said V-grooves of said template;

wherein said step (h) is performed between said steps (a) and (b).

5. A method as claimed in claim 1, wherein said step of preparing a template further includes forming said template with a semiconductor material, and forming said V-grooves by an anisotropic etching process.

6. A method as claimed in claim 5, wherein said step of preparing a template further includes forming said template with silicon.

7. A method as claimed in claim 1, wherein said step of preparing a template having opened V-grooves includes aligning said V-grooves at a pitch of approximately 100 µm or less.

8. A method as claimed in claim 1, further comprising a step (i) of heating said template to a temperature of 50 to 60° C., wherein step (i) is performed before step (c).

9. A method as claimed in claim 1, wherein step (d) includes curing said molding compound at a temperature of 100 to 150° C.

* * * * *

UNITED STATES PATENT AND TRADEMARK OFFICE
CERTIFICATE OF CORRECTION

PATENT NO. : 6,096,259
DATED : August 1, 2000
INVENTOR(S) : Nobuaki Takahashi et al.

It is certified that error appears in the above-identified patent and that said Letters Patent is hereby corrected as shown below:

Column 2,
Line 7, delete "116" insert -- 118 --

Column 8,
Line 49, delete "82" insert -- 8B --

Signed and Sealed this

Tenth Day of May, 2005

JON W. DUDAS
*Director of the United States Patent and Trademark Office*